United States Patent
Tsai et al.

(10) Patent No.: US 7,538,998 B2
(45) Date of Patent: May 26, 2009

(54) ELECTROSTATIC DISCHARGE PROTECTION CIRCUIT

(75) Inventors: Chia-Ku Tsai, Taipei (TW); Chung-Ti Hsu, Taipei (TW)

(73) Assignee: Winbond Electronics Corp., Hsinchu (TW)

( * ) Notice: Subject to any disclaimer, the term of this patent is extended or adjusted under 35 U.S.C. 154(b) by 103 days.

(21) Appl. No.: 11/454,727

(22) Filed: Jun. 16, 2006

(65) Prior Publication Data

US 2007/0096213 A1    May 3, 2007

(30) Foreign Application Priority Data

Oct. 28, 2005    (TW) .............................. 94137761 A (51) Int. Cl.
*H02H 3/22* (2006.01)
(52) U.S. Cl. ......................................... 361/56; 361/111
(58) Field of Classification Search .................... 361/56, 361/111; 257/355–360
See application file for complete search history.

(56) References Cited

U.S. PATENT DOCUMENTS

| 5,452,171 | A | 9/1995 | Metz et al. ..................... 361/56 |
| 6,034,522 | A | 3/2000 | Haywood ..................... 324/96 |
| 6,268,992 | B1 * | 7/2001 | Lee et al. ..................... 361/111 |
| 6,507,469 | B2 * | 1/2003 | Andoh ......................... 361/56 |
| 7,167,350 | B2 * | 1/2007 | Salcedo-Suner et al. ...... 361/56 |

* cited by examiner

*Primary Examiner*—Danny Nguyen
(74) *Attorney, Agent, or Firm*—J.C. Patents (57) ABSTRACT

An electrostatic discharge protection circuit comprises a pad, a first transistor, a second transistor, and a diode. Wherein, the first transistor comprises the gate, a first source-drain, and a second source-drain. The first source-drain of the first transistor is electrically coupled to the pad, and the second source-drain of the first transistor is electrically coupled to a first power line. The first source-drain of the second transistor is electrically coupled to the gate of the first transistor, the second source-drain of the second transistor is electrically coupled to the first power line, and the gate of the second transistor is electrically coupled to a second power line. The diode includes a first terminal coupled to the gate of the first transistor, and a second terminal coupled to the pad. In addition, the diode and the first transistor together form a silicon controlled rectifier (SCR).

6 Claims, 9 Drawing Sheets

ELECTROSTATIC DISCHARGE PROTECTION CIRCUIT

CROSS-REFERENCE TO RELATED APPLICATION

This application claims the priority benefit of Taiwan application serial no. 94137761, filed on Oct. 28, 2005. All disclosure of the Taiwan application is incorporated herein by reference.

BACKGROUND OF THE INVENTION

1. Field of the Invention

The present invention relates to an electrostatic discharge (ESD) protection circuit, and more particularly, to an ESD protection circuit that has a parasitic silicon controlled rectifier (SCR) and can be triggered in advance.

2. Description of the Related Art

In the conventional method for protecting the electrostatic discharge by the implementation of hardware, an on-chip ESD protection circuit is disposed between the internal circuit and the pad in order to protect its internal circuit.

Figure 1:
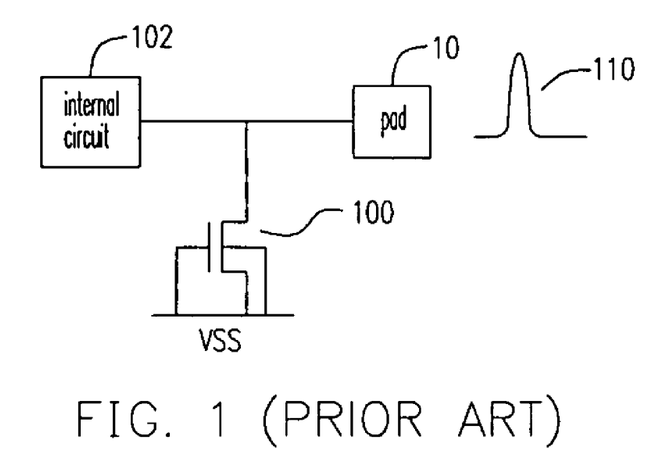
FIG. 1 schematically shows a conventional ESD protection circuit.

FIG. 1 schematically shows a conventional ESD protection circuit. When the pad 10 receives a positive charge high voltage 110, as the high voltage 110 generated by the ESD is applied to the drain of an N-type transistor 100, when the high voltage 110 exceeds an avalanche breakdown voltage between the drain and a bulk substrate, the junction between the drain of the N-type transistor 100 and the bulk substrate is broken down, and the generated basic current triggers the parasitic lateral NPN BJT (bipolar junction transistor) of the N-type transistor so as to bypass the big current generated by the ESD and thereby protect an internal circuit 102.

To meet need for the semiconductor fabricating process, thickness of a gate oxide becomes smaller, and the avalanche breakdown voltage of the gate oxide is relatively lowered. If the lowered avalanche breakdown voltage of the gate oxide in the internal circuit approaches the junction avalanche breakdown voltage of the N-type transistor 100, the high voltage generated by the ESD punches through the gate oxide of the internal circuit 102, thereby damaging the internal circuit 102.

Figure 2:
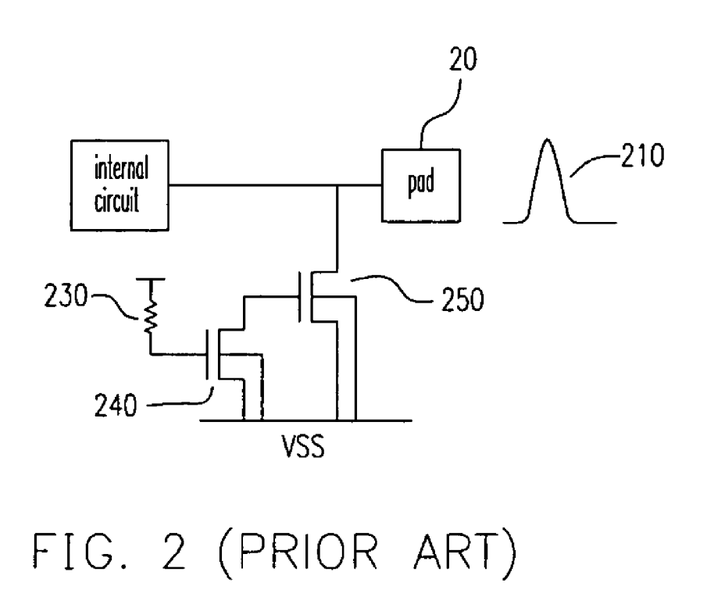
FIG. 2 schematically shows another conventional ESD protection circuit.

FIG. 2 schematically shows another conventional ESD protection circuit. The circuit shown in FIG. 2 uses an N-type transistor 240 as a resistor so as to save the area occupied by the chip. A parasitic capacitance (not shown) exists between the drain and the gate of the N-type transistor 250. Therefore, once the pad 20 receives a positive charge high voltage 210, a small positive voltage is induced on the second terminal of the parasitic capacitance, thus a voltage drop is generated between the gate and the source of the N-type transistor 250 and turns on it. Accordingly, the ESD protection element is triggered to be turned on in advance to protect the internal circuit 202. In addition, the gate of an N-type transistor 240 is electrically coupled to a voltage source VDD through a resistor 230. Thus, the N-type transistor 250 is not turned on while the IC is normally operated.

Figure 3:
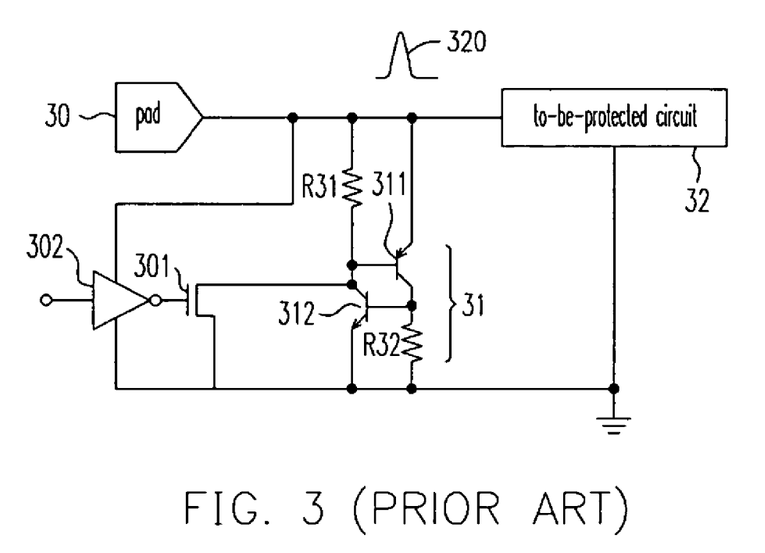
FIG. 3 schematically shows another conventional ESD protection circuit.

FIG. 3 schematically shows an ESD protection circuit disclosed in U.S. Pat. No. 5,452,171. The circuit comprises a SCR 31, an N-type transistor 301, an inverter 302, a pad 30, and a to-be-protected circuit 32. Wherein, the SCR 31 comprises a P-type BJT 311, an N-type BJT 312, and two resistors R31 and R32. When the electrostatic charge occurs between the pad 30 and the ground terminal, that is, the pad 30 receives a positive charge high voltage 320, as the high voltage 320 generated by the ESD turns on a P-type transistor inside the inverter 302, the ESD voltage is coupled to the gate of the N-type transistor 301 so as to turn on the N-type transistor 301. Therefore, in addition to using the SCR 31 to drain the ESD, the N-type transistor 301 also can be used as a path for draining the ESD.

Figure 4:
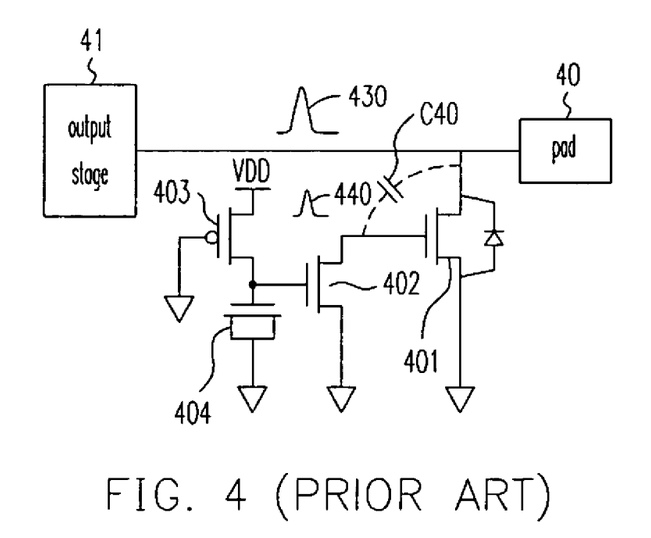
FIG. 4 schematically shows another conventional ESD protection circuit.

FIG. 4 schematically shows an ESD protection circuit disclosed in U.S. Pat. No. 6,034,552. This patent is mainly used to prevent the output stage from being damaged by the ESD. The circuit comprises a pad 40, two N-type transistors 401 and 402, a P-type transistor 403, an output stage 41, and a transistor capacitor 404.

Once the pad 40 receives a positive charge high voltage 430, the high voltage 430 generated by the ESD is coupled to the gate of the N-type transistor 401 through a parasitic capacitor C40 of the N-type transistor 401. In such a circuit design, the resistances of the P-type transistor and the transistor capacitance 404 must be high enough. Therefore, when ESD occurs, the N-type transistor 402 is cut-off. Accordingly, the N-type transistor 401 is turned on by the positive voltage 440 so that an ESD discharge path is provided. However, such circuit design wastes a larger chip layout area due to the existence of the transistor capacitance 404.

SUMMARY OF THE INVENTION

Therefore, it is an object of the present invention to provide an electrostatic discharge (ESD) protection circuit for protecting the IC elements from being damaged by the ESD.

The present invention provides an ESD protection circuit. The circuit comprises a pad, a first transistor doped with a first type impurity, a second transistor doped with the first type impurity, a resistance element, and a diode. The first transistor comprises the gate, a first source-drain, a second source-drain, and a bulky substrate. The first source-drain of the first transistor is electrically coupled to the pad, and the second source-drain and the bulk substrate of the first transistor are electrically coupled to a first power line. The resistance element comprises a first terminal and a second terminal. The first terminal of the resistance element is electrically coupled to the gate of the first transistor, and the second terminal of the resistance element is electrically coupled to the first power line. The diode comprises a first terminal and a second terminal. The first terminal of the diode is electrically coupled to the gate of the first transistor, and the second terminal is electrically coupled to the pad.

The present invention provides a structure of an ESD protection circuit. The structure comprises a pad, a first type of a first transistor, a first type of a second transistor, a resistance element, and a diode. The first transistor comprises the gate, a first source-drain, a second source-drain, and a bulk substrate. The first source-drain of the first transistor is electrically coupled to the pad as well as the second source-drain and the bulk substrate of the first transistor are electrically coupled to a first power line. The second transistor comprises the gate, a first source-drain, a second source-drain, and a bulk substrate. The first source-drain of the second transistor is electrically coupled to the gate of the first transistor, the second source-drain and the bulky substrate of the second transistor are electrically coupled to the first power line, and the gate of the second transistor is electrically coupled to a second power line through the resistance element. The diode comprises a first terminal and a second terminal. The first terminal of the diode is electrically coupled to the gate of the first transistor, and the second terminal of the diode is electrically coupled to the pad.

In the ESD protection circuit according to a preferred embodiment of the present invention, the resistance element is a polysilicon resistor, and the structure of the first transistor is a finger type structure. When the first type is the N-type, the first power line is VSS, and the second power line is VDD. In addition, the structure of the diode comprises: an N-well disposed in a P-type substrate; a first P-doped region disposed in the N-well as an anode of the diode; and an N-doped region and a second P-doped region disposed in the N-well as a cathode of the diode.

When the first type is the P-type, the first power line is the VDD, and the second power line is the VSS. In addition, the structure of the diode comprises: a first N-doped region disposed in the substrate as a cathode of the diode; and a P-doped region and a second N-doped region disposed in the substrate as an anode of the diode.

In the present invention, the diode is electrically coupled to the first transistor. Thus in terms of the structure, the diode can be used as a capacitor, and the second transistor can be used as a resistor. When the ESD occurs, the voltage is coupled to the gate of the first transistor, such that the trigger voltage of the protection element is lowered, and the diode and the first transistor together form a SCR. Accordingly, the ESD ability is enhanced, and the capability of the ESD sustenance of the IC is promoted.

BRIEF DESCRIPTION DRAWINGS

The accompanying drawings are included to provide a further understanding of the invention, and are incorporated in and constitute a part of this specification. The drawings illustrate embodiments of the invention, and together with the description, serve to explain the principles of the invention.

DESCRIPTION PREFERRED EMBODIMENTS

Figure 5:
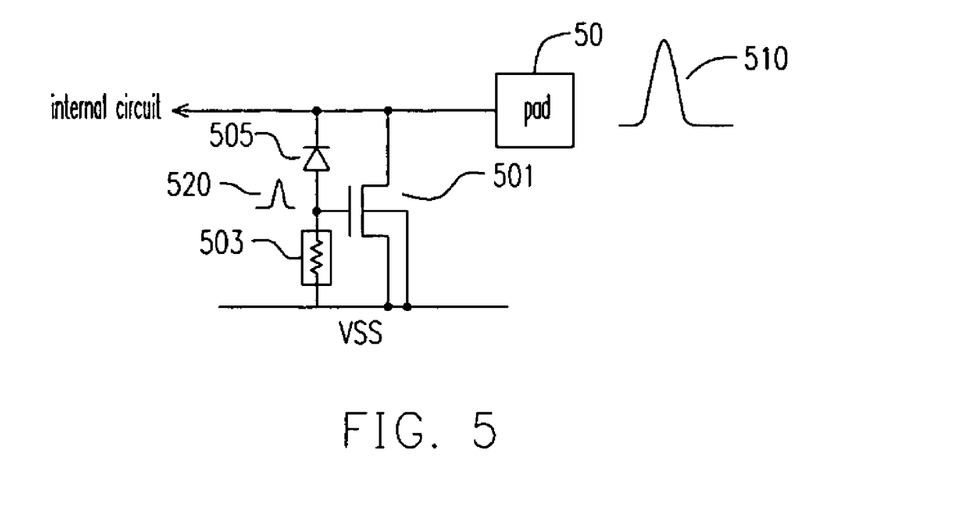
FIG. 5 schematically shows an ESD protection circuit according to an embodiment of the present invention.

FIG. 5 schematically shows an ESD protection circuit according to an embodiment of the present invention. Referring to FIG. 5, the circuit comprises a pad 50, an N-type transistor 501, a resistance element 503, and a diode 505. Wherein, a first source-drain of the N-type transistor 501 is electrically coupled to the pad 50, and a second source-drain and a bulky substrate of the N-type transistor 501 are electrically coupled to the VSS. The resistance element 503 comprises a first terminal and a second terminal. The first terminal of the resistance element 503 is electrically coupled to the gate of the N-type transistor 501, and the second terminal of the resistance element 503 is electrically coupled to the VSS. The diode 505 comprises a first terminal and a second terminal. The first terminal of the diode 505 is electrically coupled to the gate of the N-type transistor 501, and the second terminal of the diode 505 is electrically coupled to the pad 50. Taking the ESD occurring between the pad 50 and the VSS as an example, if the pad 50 receives a positive charge high voltage 510, the high voltage 510 generated by the ESD is applied to the first source-drain of the N-type transistor 501 and the cathode of the diode. As the diode 505 operates as a capacitor at high frequency, when the pad 50 receives the positive charge high voltage 510, a small positive voltage 520 is induced on the second terminal of the diode 505. Thus, a voltage drop occurs between the gate and the source of the N-type transistor 501 that is then promptly turned on. Accordingly, the ESD protection element is triggered and turned on in advance such that the internal circuit is protected.

In addition, when the high voltage 510 exceeds the avalanche breakdown voltage between the drain and the bulky substrate, the junction between the drain and the bulk substrate of the N-type transistor 501 is broken down. Therefore, the trigger current generated by turning on the parasitic lateral NPN BJT (bipolar junction transistor) of the N-type transistor 501 is large enough to trigger the SCR formed by the diode 505 and the N-type transistor 501, such that a second ESD discharge path is provided. In addition, as the SCR is able to sustain a larger ESD discharge current and provide a higher ESD sustenance, the internal circuit is effectively protected.

Figure 6:
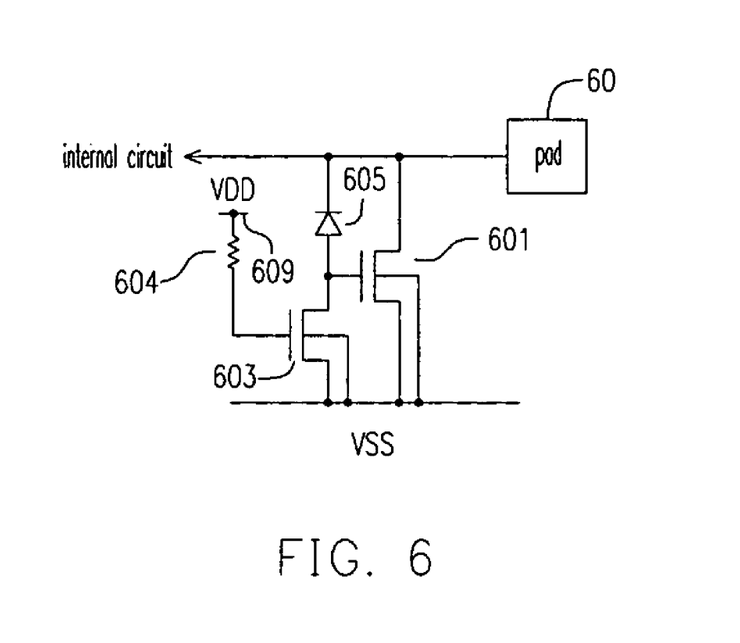
FIG. 6 schematically shows an ESD protection circuit according to another embodiment of the present invention.

FIG. 6 schematically shows an ESD protection circuit according to another embodiment of the present invention. Referring to FIG. 6, the circuit shown in FIG. 6 differs the circuit shown in FIG. 5 in that the resistance element 503 shown in FIG. 5 is replaced with an N-type transistor 603 and a resistor 604 shown in FIG. 6. Wherein, a first terminal of the resistor 604 is electrically coupled to the VDD, and a second terminal of the resistor 604 is electrically coupled to the gate of the N-type transistor 603. A first source-drain of the N-type transistor 603 is electrically coupled to a first terminal of the diode 605, and a second source-drain and a bulk substrate of the N-type transistor 603 are electrically coupled to a first power line 607 VSS. With such a configuration, the chip-occupied layout area is effectively saved.

Figure 7:
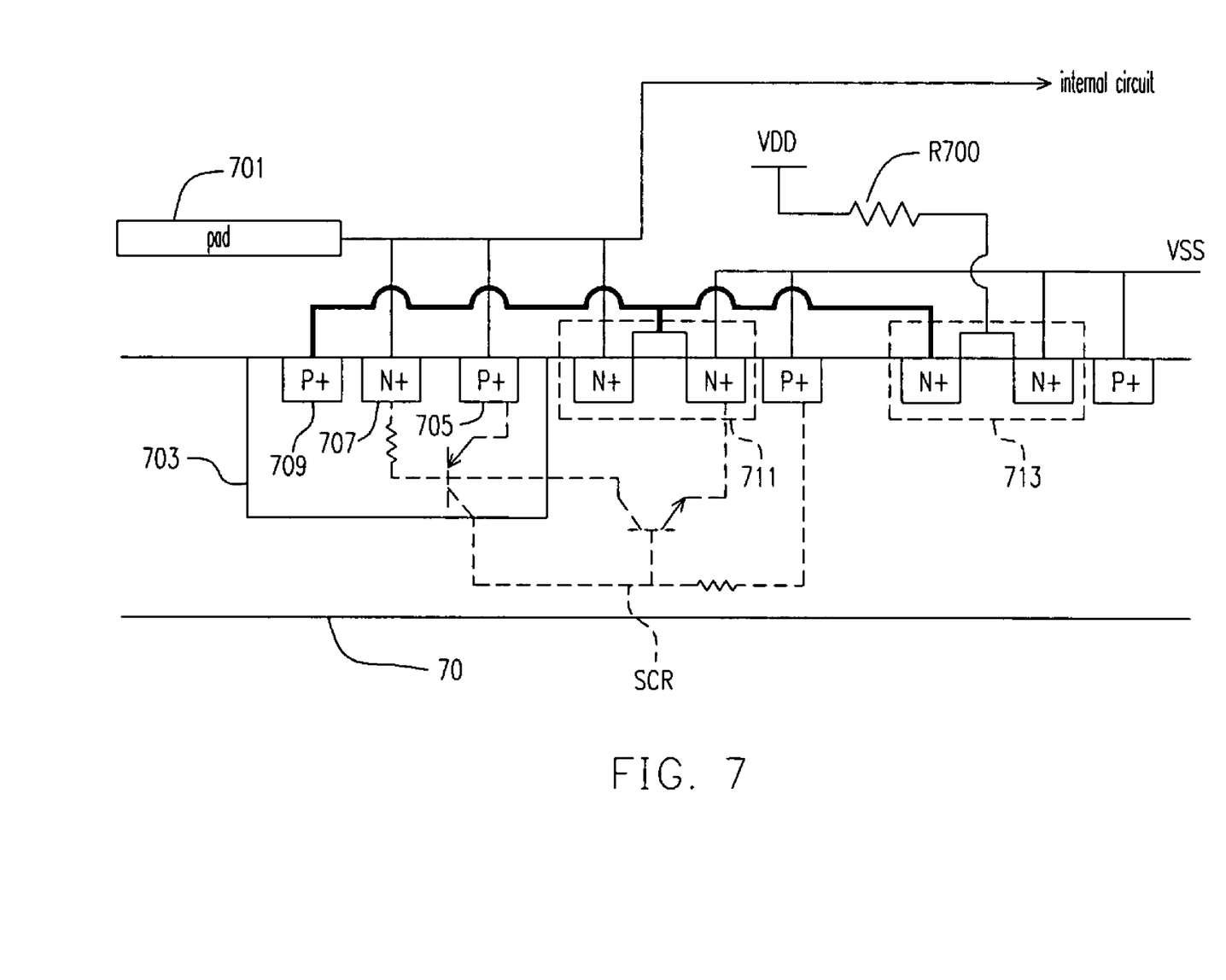
FIG. 7 schematically shows a sectional structure diagram of an ESD protection circuit according to another embodiment of the present invention.

FIG. 7 schematically shows a sectional structure of an ESD protection circuit according to another embodiment of the present invention. The structure of the ESD protection circuit comprises a pad 701 disposed on a P-type substrate 70, an N-well 703 disposed in the P-type substrate 70, a P-doped region 705 and an N-doped region 707 separately disposed in the N-well 703 and both electrically coupled to the pad 701, a P-doped region 709 disposed in the N-well 703, an N-type transistor 711 disposed on the P-type substrate 70 and outside of the N-well 703. Wherein the gate of the N-type transistor 711 is electrically coupled to the P-doped region 709, a first source-drain of the N-type transistor 711 is electrically coupled to the pad 701, and a second source-drain and the bulk substrate of the N-type transistor 711 are electrically coupled to the VSS. Moreover, an N-type transistor 713 is disposed in the P-type substrate 70 outside of the N-well 703, the gate of the N-type transistor 713 is electrically coupled to the VDD through a polysilicon resistor R700, a first source-drain of the N-type transistor 713 is electrically coupled to the gate of the N-type transistor 711, and a second source-drain and the bulk substrate of the N-type transistor 713 are electrically coupled to the VSS.

Referring to FIGS. 7 and 6, the N-well 703 and the P-doped region 709 disposed in the N-well 703 together form the diode 605 in FIG. 6. In addition, the diode 605 is electrically coupled to the pad 701 through the P-doped region 705 and the N-doped region 707.

Figure 8:
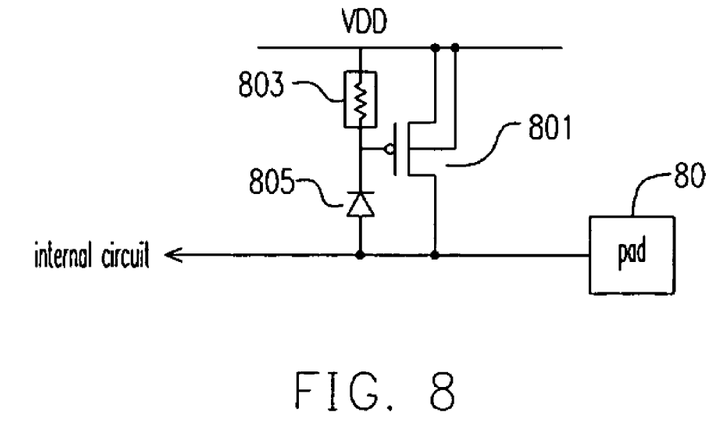
FIG. 8 schematically shows an ESD protection circuit according to another embodiment of the present invention.
Figure 9:
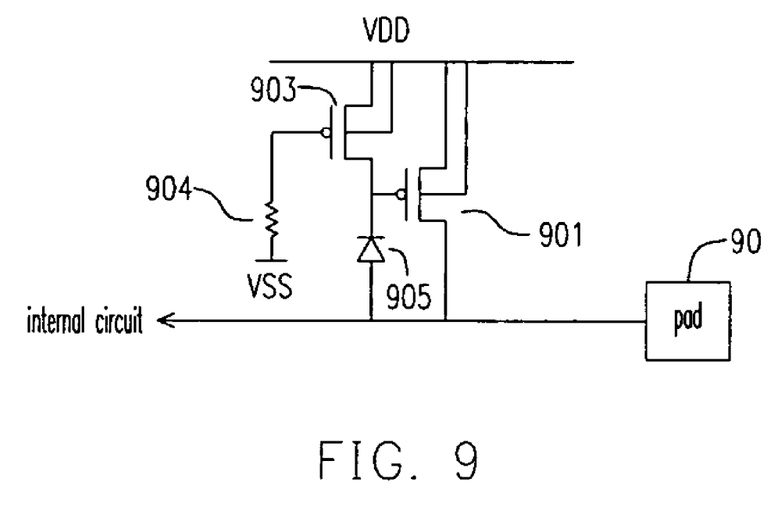
FIG. 9 schematically shows an ESD protection circuit according to another embodiment of the present invention.

Similarly, like the embodiments described in FIGS. 5 and 6, the invention can be disposed between a pad and a VDD in FIGS. 5 and 6 by replacing a N-type transistor with a P-type transistor as well. As shown in FIGS. 8 and 9, a first terminal of the resistance element is electrically coupled to the gate of the P-type transistor 801, and a second terminal of the resistance element is electrically coupled to the VDD. A first terminal of the diode 805 is electrically coupled to the gate of the P-type transistor 801, and a second terminal of the diode 805 is electrically coupled to the pad 80. The first source-drain of the P-type transistor 901 (or 801) and 903 are electrically coupled to the pad, and the second source-drain of the P-type transistor 901 (or 801) and 903 are electrically coupled to the VDD. The gate of the P-type transistor 903 is electrically coupled to the VSS through a resistor 904.

Figure 10:
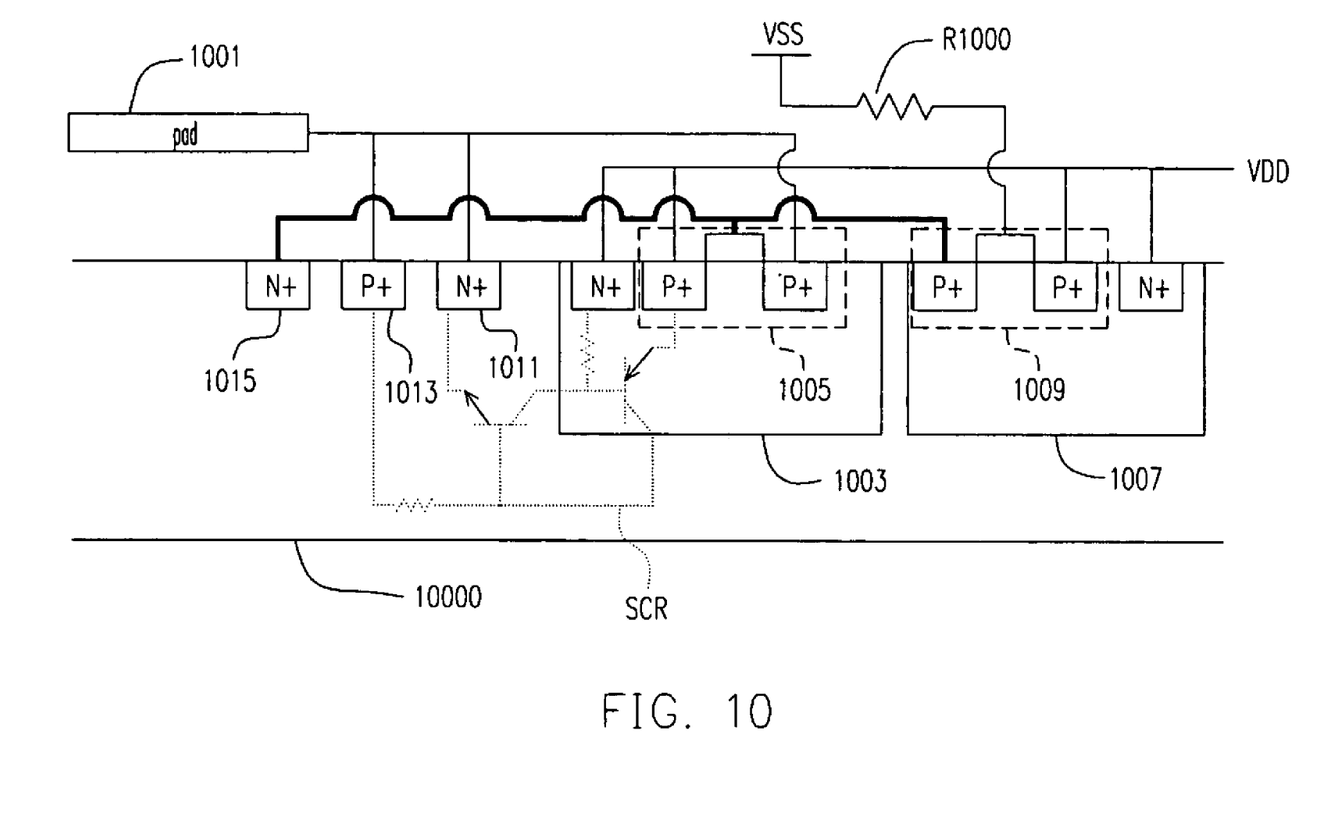
FIG. 10 schematically shows a sectional structure diagram of an ESD protection circuit according to the embodiment of the present invention shown in FIG. 9.

FIG. 10 schematically shows a sectional structure of an ESD protection circuit according to the embodiment of the present invention shown in FIG. 9. The structure comprises: a pad 1001 disposed on a P-type substrate 10000, a first N-well 1003 and a second N-well 1007 disposed in the P-type substrate 10000, a P-type transistor 1005 disposed in the first N-well 1003, wherein a first source-drain of the P-type transistor 1005 is electrically coupled to the pad, and a second source-drain and a bulk substrate of the P-type transistor 1005 are electrically coupled to the VDD. Furthermore, a P-type transistor 1009 is disposed in the second N-well 1007, wherein the gate thereof is electrically coupled to the VSS through a polysilicon resistor R1000, a first source-drain thereof is electrically coupled to the gate of the P-type transistor 1005, as well as a second source-drain and a bulk substrate thereof are electrically coupled to the VDD. Moreover, an N-doped region 1011, a P-doped region 1013, and an N-doped region 1015 are disposed outside of the first N-well 1003 and the second N-well 1007, wherein the N-doped region 1011 and the P-doped region 1013 are electrically coupled to the pad 1001 and an N-well 1007 is electrically coupled to the gate of the P-type transistor 1005.

Referring to FIGS. 10 and 9, the N-doped region 1015 and the P-type substrate 10000 are used as a PN junction in FIG. 10, and the P-doped region 1013 and the N-doped region 1011 together form the diode 905 of FIG. 9. In addition, the diode 905 is electrically coupled to the pad 701 through the P-doped region 1013 and the N-doped region 1011.

Figure 11:
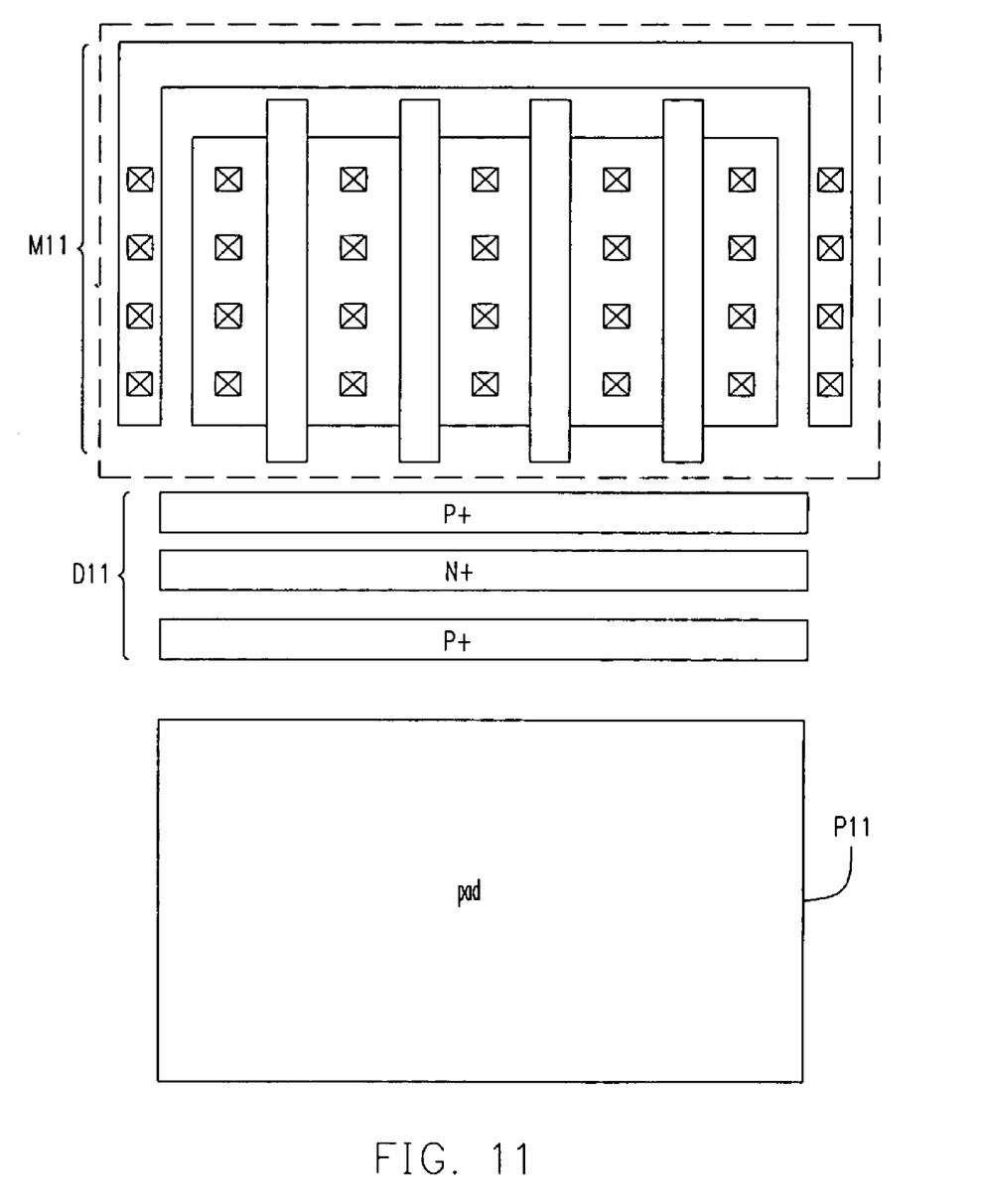
FIG. 11 schematically shows a top view layout diagram of the first transistor and the diode in the circuit according to the embodiment of the present invention shown in FIG. 6.
Figure 12:
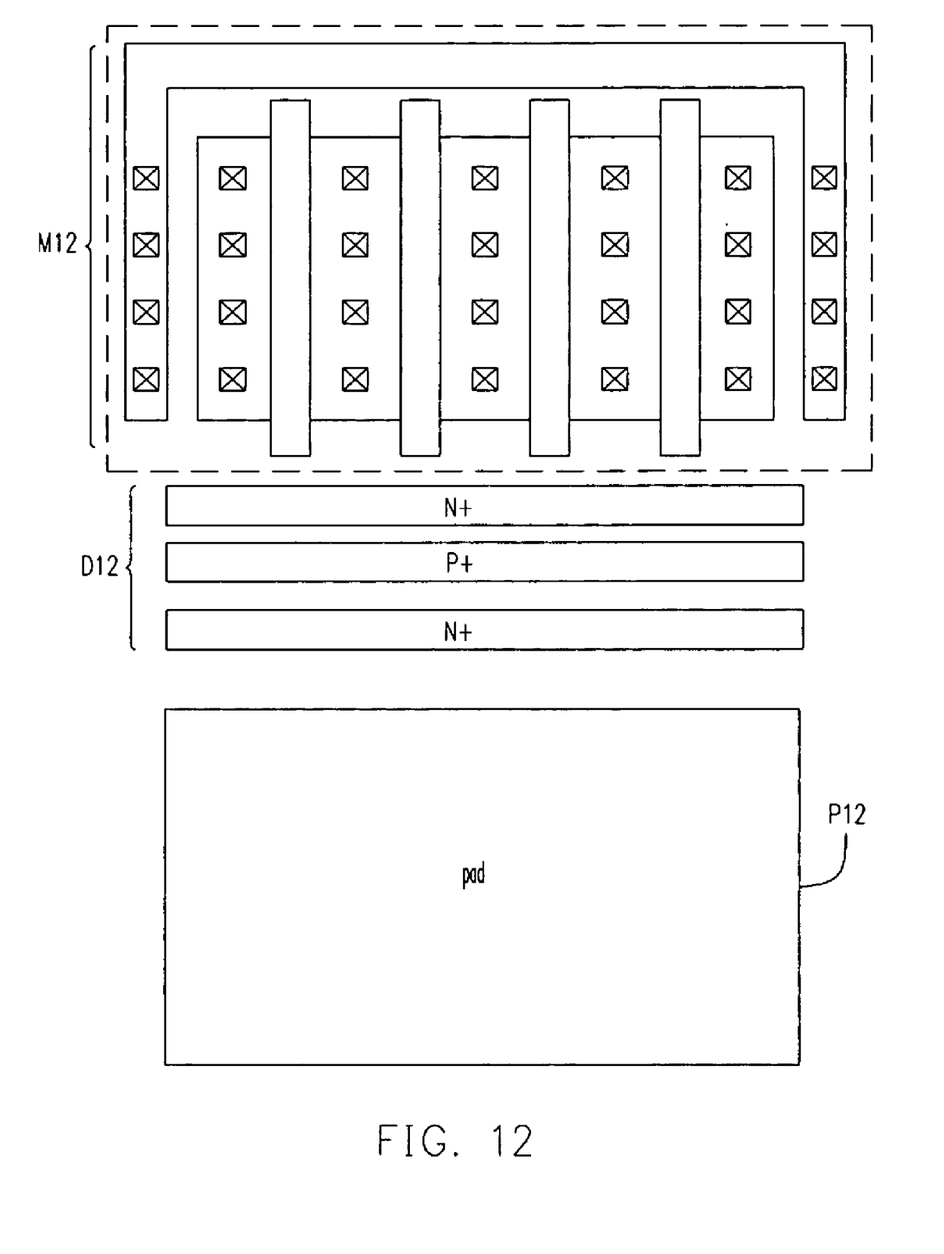
FIG. 12 schematically shows a top view layout diagram of the first transistor and the diode in the circuit according to the embodiment of the present invention shown in FIG. 9.

FIGS. 11 and 12 are top view layout diagrams of the N-type transistor 601 or the P-type transistor 901 and the diode in the circuits according to the embodiments of the present invention shown in FIGS. 6 and 9, respectively. Wherein, the N-type transistor 601 or the P-type transistor 901 may be configured as a finger type, such as the transistor structure layout in the M11 or M12 area. In addition, the diode 605 or 905 may be disposed between the pad P11 or P12 and the first transistor M11 or M12, e.g. in the D11 or D12 area.

Figure 13A:
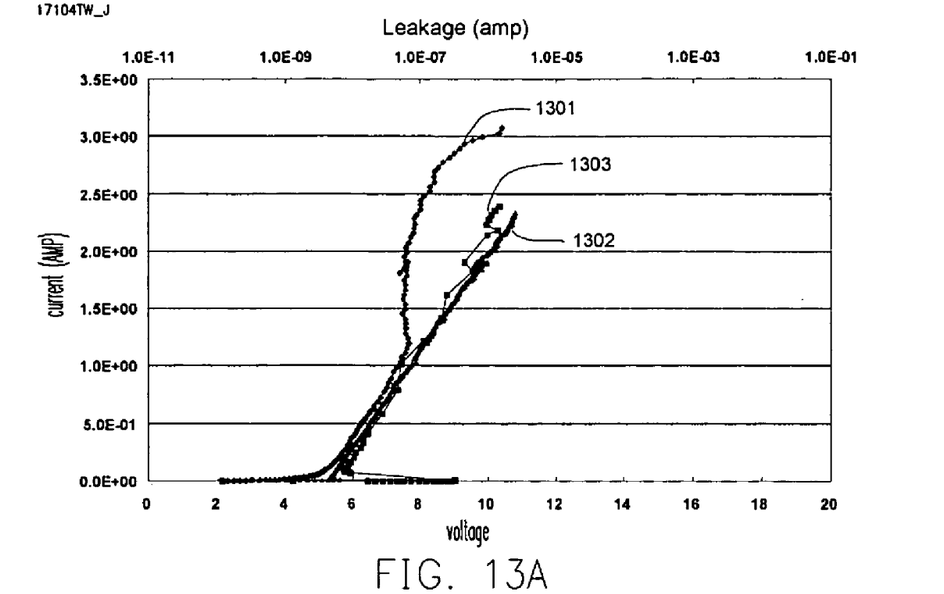
FIGS. 13A and 13B schematically show the experiment results of the circuit according to the present invention and the conventional circuits in FIG. 1 and FIG. 2, respectively.
Figure 13B:
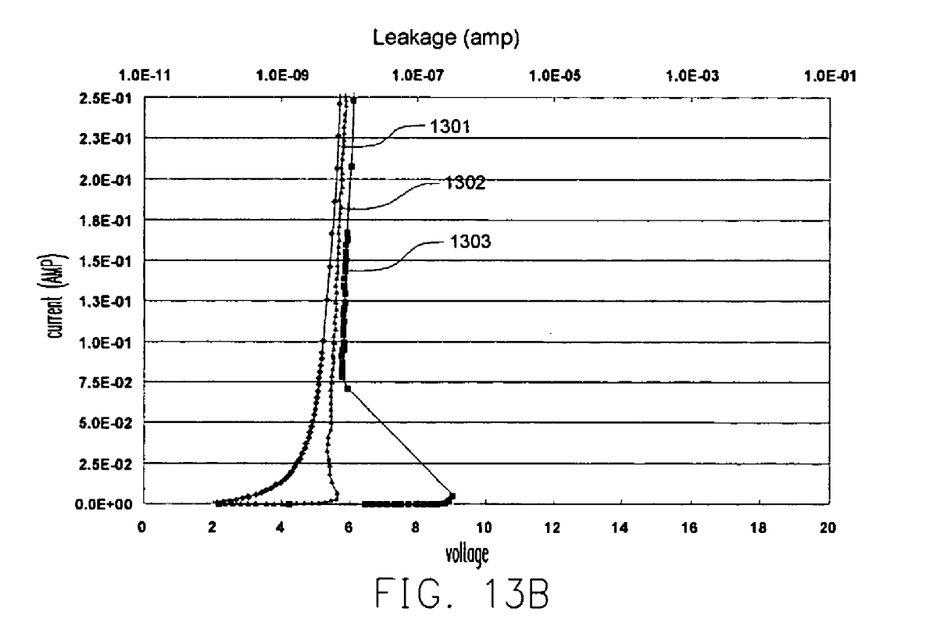

FIGS. 13A and 13B schematically show the experiment results of the circuit according to the present invention and the conventional circuits shown in FIG. 1 and FIG. 2, respectively. FIG. 13B is a magnified diagram of the low current axis area of FIG. 13A. In addition, the reference numeral 1031 in FIGS. 13A and 13B represents the I-V curve of the embodiment in the present invention, the reference numeral 1302 is the I-V curve of the conventional circuit shown in FIG. 2, and the reference numeral 1303 is the I-V curve of the conventional circuit shown in FIG. 1.

Referring to FIG. 13A, it shows a parabola curve occurs at 8V in the curve 1301 and this is because the parasitic SCR formed by the diode and the N-type transistor 601 or the P-type transistor 901 is triggered and activated. Thus, the voltage of the pad relative to the ground is clamped at 8V when the current is 2.5 A (amp). However, in the curves 1302 and 1303, the voltage of the pad relative to the ground is clamped at 10V when the current is 2.5 A (amp) 1. After the current exceeds 2.5 A, only the circuit of the represent embodiment is normally operated, the other two conventional circuits are burned. In addition, referring to FIG. 13B, there shows an experiment result curve 1301 when the circuit, according to the embodiment of the present invention, is triggered at 4V. The circuit is triggered at 6V in the curve 1302 and at 9V in the curve 1303. As described above, the circuit of the present invention is triggered ahead of the conventional ESD protection circuit, which proves the ESD protection circuit provided by the present embodiment is more suitable for applying to deep sub-micro CMOS fabricating process. Moreover, according to the experiment figures 1301 of the present embodiment, the circuit provided by the present invention has a lower trigger voltage than the ESD protection circuit as disclosed in U.S. Pat. No. 5,452,171.

Although the invention has been described with reference to a particular embodiment thereof, it will be apparent to one of the ordinary skills in the art that modifications to the described embodiment may be made without departing from the spirit of the invention. Accordingly, the scope of the invention will be defined by the attached claims not by the above detailed description.

What is claimed is:

1. An electrostatic discharge (ESD) protection circuit, comprising:
    a pad;
    a first transistor having the gate, a first source-drain, a second source-drain, and a bulk substrate, wherein the first source-drain is electrically coupled to the pad, and the second source-drain and the bulk substrate are electrically coupled to a first power line;
    a resistance element having a first terminal and a second terminal, wherein the first terminal is electrically coupled to the gate of the first transistor, and the second terminal is electrically coupled to the first power line; and
    a diode having a first terminal and a second terminal, wherein the first terminal is directly coupled to the gate of the first transistor, and the second terminal is directly coupled to the pad; wherein the first transistor is an N-type metallic oxide semiconductor field effect transistor (MOSFET) as well as the first terminal of the diode is an anode and the second terminal of the diode is a cathode; wherein the diode and the first transistor together form a silicon controlled rectifier (SCR).

2. The ESD protection circuit of claim 1, wherein the structure of the diode comprises:
    an N-well disposed in a substrate;
    a first P-doped region disposed in the N-well as the anode of the diode;
    an N-doped region disposed in the N-well as the cathode of the diode; and
    a second P-doped region disposed in the N-well as the cathode of the diode.

3. The ESD protection circuit of claim 1, wherein the resistance element comprises:
    a second transistor having the gate, a first source-drain, a second source-drain, and a bulk substrate, wherein the first source-drain acts as a first terminal of the resistance element, and the second source-drain and the bulk substrate acts as a second terminal of the resistance element; and a resistor having a first terminal electrically coupled to a second power line, and a second terminal electrically coupled to the gate of the second transistor.

4. The ESD protection circuit of claim 3, wherein the second transistor is an N-type metallic oxide semiconductor field effect transistor (MOSFET).

5. The ESD protection circuit of claim 1, wherein the resistance element is a polysilicon resistor.

6. The ESD protection circuit of claim 1, wherein the structure of the first transistor is a finger type structure.

* * * * *